United States Patent [19]

Jung et al.

[11] Patent Number: 5,981,142
[45] Date of Patent: Nov. 9, 1999

[54] PHOTORESIST COPOLYMER

[75] Inventors: Jae Chang Jung; Cheol Kyu Bok; Hyung Gi Kim, all of Kyoungki-do, Rep. of Korea

[73] Assignee: Hyundai Electronics Industries, Co., Ltd., Kyoungki-do, Rep. of Korea

[21] Appl. No.: 08/954,871

[22] Filed: Oct. 21, 1997

[30] Foreign Application Priority Data

Oct. 24, 1996 [KR] Rep. of Korea ............. 96-47901

[51] Int. Cl.⁶ ............. G03C 1/492; C08L 35/00
[52] U.S. Cl. ............. 430/270.1; 430/910; 525/205; 525/221; 525/222
[58] Field of Search ............. 430/270.1, 325, 430/910; 525/329.9, 205, 221, 222

[56] References Cited

U.S. PATENT DOCUMENTS

| | | | |
|---|---|---|---|
| 4,246,374 | 1/1981 | Kopchik | 525/329 |
| 4,524,121 | 6/1985 | Gleim et al. | 430/176 |
| 4,569,897 | 2/1986 | Kalyanaraman | 430/197 |
| 4,837,124 | 6/1989 | Wu et al. | 430/270 |
| 5,019,488 | 5/1991 | Mammato et al. | 430/325 |
| 5,227,280 | 7/1993 | Jubinsky et al. | 430/312 |
| 5,248,725 | 9/1993 | Koyama et al. | 525/64 |
| 5,420,209 | 5/1995 | Boutevin et al. | 525/379 |
| 5,879,853 | 3/1999 | Azuma | 430/166 |

FOREIGN PATENT DOCUMENTS

| | | |
|---|---|---|
| 60-159744 | 8/1985 | Japan . |
| 62-229242 | 10/1987 | Japan . |
| 5-241341 | 9/1993 | Japan . |

*Primary Examiner*—John A. McPherson
*Assistant Examiner*—Rosemary Ashton
*Attorney, Agent, or Firm*—Thelen Reid & Priest L.L.P.

[57] ABSTRACT

A copolymer useful as a photoresist resin for submicrolithography, comprising glutarimide derivatives and acrylic acid derivatives as shown in Formula I and a photoresist composition comprising the same.

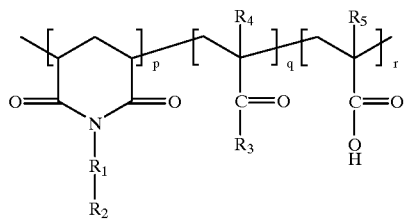

wherein, $R_1$ is a straight or branched alkyl group containing 0–30 carbon atoms; $R_2$ and $R_3$ independently represent straight or branched alkoxy or cycloalkoxy groups containing 1–15 substituted or non-substituted carbon atoms; $R_4$ and $R_5$ independently represent hydrogen or an alkyl group; and p, q and r, which may be the same or different, each is a polymerization ratio; p ranges from 10 to 90, q ranges from 10 to 90 and r ranges from 0 to 50.

4 Claims, No Drawings

PHOTORESIST COPOLYMER

BACKGROUND OF THE INVENTION

1. Field of the Invention

The present invention relates to a photoresist copolymer suitable for the submicrolithography to highly integrate semiconductor devices. More particularly, the present invention relates to a photoresist copolymer consisting of glutarimide derivatives and acrylic acid derivatives, which are of high etch resistance and thermal resistance. Also, the present invention is concerned with a photoresist composition comprising such a copolymer.

2. Description of the Prior Art

Recently, chemical amplification photoresist has been prevailing in semiconductor devices because it was found to be highly sensitive to DUV (Deep Ultra Violet) light, which is now recognized as a light source suitable for accomplishing the high integration of semiconductor devices. Chemical amplification photoresist consists generally of a photoacid generator and a matrix polymer having such a chemical structure which sensitively reacts with acid.

The mechanism of such a photoresist is as follows. When the photoresist is exposed through a mask to a DUV light source, protons are generated by the action of the photoacid generator and then, react with the main or side chain of the matrix polymer. This reaction exceptionally increases the solubility of the copolymer in a developing solution by converting the structure of the copolymer, e.g. by decomposing it, cross-linking it or changing its polarity. Therefore, when being treated with the developing solution, the copolymer is dissolved at exposed regions whereas it remains undissolved at un-exposed regions, leaving the shape of the mask as a positive image on a substrate.

There is a relation between a resolution and the wavelength of a light source in photolithography, as shown in the following formula:

$$R = k \times \lambda / NA$$

wherein R is a resolution; k is a process constant; $\lambda$ is a wavelength of a light source; and NA is a numerical aperture. As implicated, the smaller the wavelength of light source, the finer the pattern formed.

Accordingly, a research has been directed to find new light sources suitable to improve the resolution. In result, a DUV light was developed as a light source for the integration of semiconductor devices into 1 giga or higher scale. Examples of the DUV light source in current use include krypton fluoride excimer laser (hereinafter referred to as "KrF") and argon fluoride excimer laser (hereinafter referred to as "ArF") which are 248 nm and 193 nm in wavelength, respectively. The latter light source is used for 4G or higher scale DRAM. According to the finding of this new light source, suitable photoresist films should be developed.

In general, a photoresist is required to be of high etch resistance and thermal resistance. In order to improve the etch resistance, aromatic resins are usually sought out. However, because the aromatic resins show high absorbance at short wavelengths, the photoacid generator is illuminated with a reduced amount of light energy and thus, has a reduced opportunity to produce protons.

In the case of using a short wavelength light source, such as ArF, poly(methylmethacrylate) (PMMA) resins, rather than aromatic resins, are used. PMMA resins, however, are difficult to apply in practice because of their poor etch resistance and thermal resistance.

SUMMARY OF THE INVENTION

Therefore, it is an object of the present invention to overcome the above problems encountered in prior arts and to provide a novel copolymer which can be used as a photoresist resin in submicrolithography employing ArF as a light source and which is superior in etch resistance and thermal resistance.

It is another object of the present invention to provide a novel copolymer useful as a photoresist resin which can be patterned with high resolution and sensitivity.

It is a further object of the present invention to provide a photoresist composition suitable for the high integration of semiconductor devices.

DETAILED DESCRIPTION OF THE INVENTION

The present invention pertains to a photoresist copolymer, represented by the following structural formula I:

[FORMULA I]

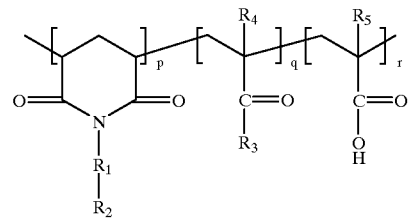

wherein, $R_1$ is a straight or branched alkyl group containing 0–30 carbon atoms;

$R_2$ and $R_3$ independently represent straight or branched alkoxy or cycloalkoxy groups containing 1–15 substituted or non-substituted carbon atoms;

$R_4$ and $R_5$ independently represents hydrogen or an alkyl group; and p, q and r, which may be the same or different, each are a polymerization ratio ranging from 0 to 90. For example, within this range, p can range from 10 to 90, q can range from 10 to 90, and r can range from 0 to 50. As another example, p can range from 10 to 80, q can range from 10 to 80. and r can range from 10 to 50.

A preferable coploymer of the formula I is represented by the following formula II:

[FORMULA II]

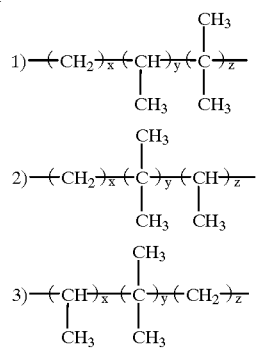

-continued

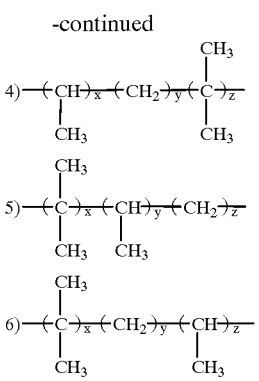

Wherein, $R_1$ is a alkyl group of formula II; wherein, x, y and z, which may be the same or different, each are an integer not more than 5.

A more important detail concerning $R_2$ and $R_3$ is in the pool of alkoxy groups represented by the following formula III:

$R_4$ and $R_5$ independently represents hydrogen or an alkyl group; and p, q and r, which may be the same or different, each are a polymerizatio n ratio ranging from 0 to 90.

[FORMULA III]

$R_2, R_3 =$

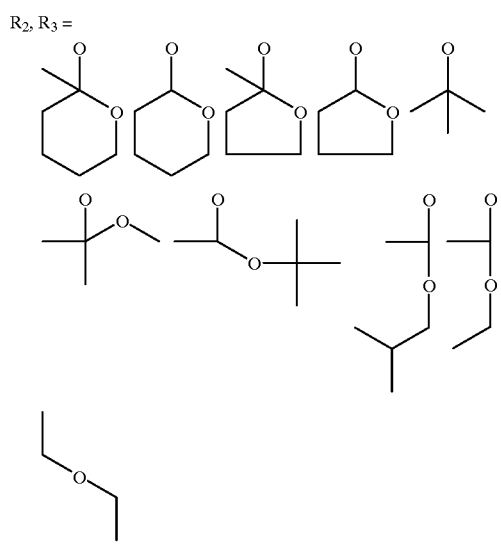

The polymerization ratios, p, q and r, are determined by the amounts of the monomers added upon polymerization.

The novel copolymers of the present invention, consisting of glutarimide derivatives and acrylic acid derivatives, may be produced according to ordinary radical polymerization techniques using radical polymerization initiators.

They are polymerized in bulk polymerization or in a solution polymerization. For polymerization solvent, cyclohexanone, methylethylketone, benzene, toluene, dioxane, dimethylformamide alone or the combinations thereof may be used. Usually, the polymerization is carried out in the presence of a polymerization initiator, such as benzoylperoxide, 2,2'-azobisisobutyronitrile (AIBN), acetyl peroxide, lauryl peroxide, or t-butylperacetate.

A positive photoresist composition useful for forming positive fine patterns in semiconductor devices may be obtained by mixing the novel photoresist copolymer of Formula I with a photoacid generator in an organic solvent in a typical manner. Upon formulation, the amount of the copolymer is dependent on the organic solvent, the photoacid generator and the lithography conditions and is preferably about 5–40% by weight of the organic solvent used. Optionally, the compounds having the same structure of $R_2$ and/or $R_3$ of Formula I, may be added as dissolution inhibitors.

To prepare a photoresist, the copolymer of the invention is first dissolved in cyclohexanone at an amount of 10–30% by weight and an onium salt or organic sulfonic acid, as a photoacid generator, is added at an amount of about 0.1–10% by weight of the resist polymer. Then, this solution is filtered with an ultrafine filter to yield a photoresist solution.

This photoresist solution is spin-coated on a silicon wafer which is, then, soft-baked at a temperature of 80–150° C. for 1–5 min in an oven or on a hot plate. An exposure process is carried out by use of a stepper which uses deep uv light or an excimer laser as a light source. Thereafter, the wafer is subjected to post-baking at a temperature of 100–200° C. An ultrafine positive resist image can be obtained by immersing the post-baked wafer in a 2.38% TMAH solution for 90 seconds.

As described hereinbefore, the photoresist prepared from the novel copolymer of the present invention can be coated to a thickness of 1.0 μm or less by virtue of its high etch resistance and thermal resistance, thereby obtaining satisfactory results in resolution and depth of focus.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A photoresist copolymer represented by the following formula I:

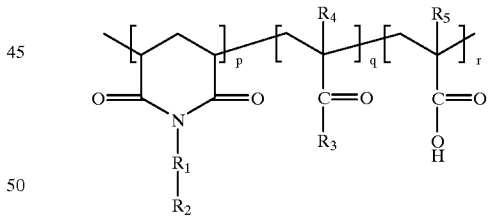

wherein, $R_1$ is selected from the group consisting of:

$R_1 =$

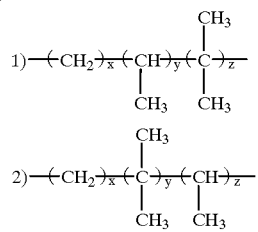

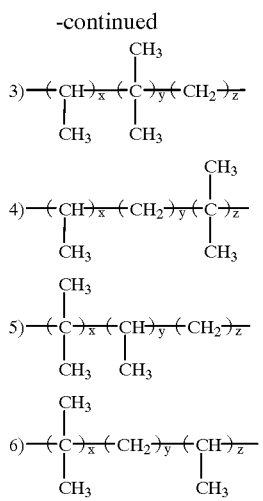

wherein x, y and z, which may be the same or different, each is an integer not more than 5, wherein $R_2$ and $R_3$ are independently selected from the group consisting of:

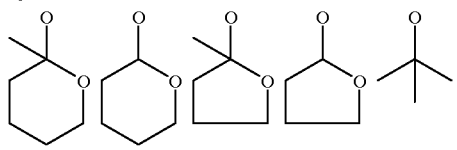

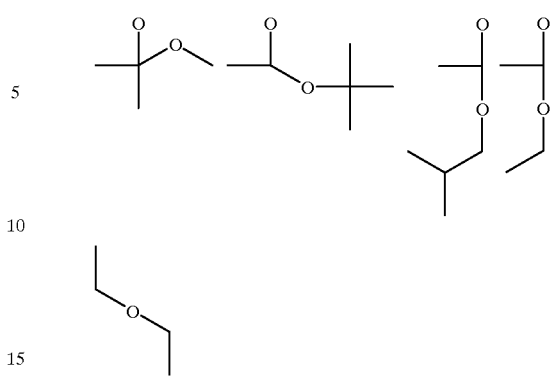

$R_4$ and $R_5$ independently represent hydrogen or an alkyl group; and wherein p, q and r are polymerization ratios; wherein p ranges from 10 to 90, q ranges from 10 to 90 and r ranges from 0 to 50.

2. A photoresist copolymer in accordance with claim 1, wherein p ranges from 10 to 80, q ranges from 10 to 80, and r ranges from 10 to 50.

3. A photoresist composition comprising the photoresist copolymer of claim 2.

4. A photoresist composition comprising the photoresist copolymer of claim 1.

* * * * *